United States Patent
Prechtl et al.

(10) Patent No.: US 9,728,630 B2
(45) Date of Patent: Aug. 8, 2017

(54) HIGH-ELECTRON-MOBILITY TRANSISTOR HAVING A BURIED FIELD PLATE

(71) Applicant: Infineon Technologies Austria AG, Villach (AT)

(72) Inventors: Gerhard Prechtl, Rosegg (AT);
Clemens Ostermaier, Villach (AT);
Oliver Haeberlen, Villach (AT)

(73) Assignee: Infineon Technologies Austria AG, Villach (AT)

( * ) Notice: Subject to any disclaimer, the term of this patent is extended or adjusted under 35 U.S.C. 154(b) by 75 days.

(21) Appl. No.: 14/478,287

(22) Filed: Sep. 5, 2014

(65) Prior Publication Data
US 2016/0071967 A1  Mar. 10, 2016

(51) Int. Cl.
*H01L 29/778* (2006.01)
*H01L 21/02* (2006.01)
(Continued)

(52) U.S. Cl.
CPC ...... *H01L 29/7787* (2013.01); *H01L 21/0254* (2013.01); *H01L 21/30612* (2013.01);
(Continued)

(58) Field of Classification Search
CPC . H01L 31/109; H01L 31/072; H01L 29/7787; H01L 29/66462; H01L 29/407;
(Continued)

(56) References Cited

U.S. PATENT DOCUMENTS

| 7,211,839 | B2 | 5/2007 | Kachi et al. |
| 2006/0065912 | A1* | 3/2006 | Beach ................. H01L 29/0657 257/194 |

(Continued)

FOREIGN PATENT DOCUMENTS

| JP | 62291181 S | 12/1987 |
| JP | 10125698 H | 5/1998 |

(Continued)

OTHER PUBLICATIONS

Curatola, Gilberto et al., "Compound Semiconductor Device with Buried Field Plate", U.S. Appl. No. 13/331,970, filed Dec. 20, 2011.

*Primary Examiner* — Fernando L Toledo
*Assistant Examiner* — Lawrence-Linh T Nguyen
(74) *Attorney, Agent, or Firm* — Murphy, Bilak & Homiller, PLLC

(57) ABSTRACT

A high-electron-mobility field effect transistor is formed with a buffer region having a stepped lateral profile, the stepped lateral profile having first, second and third cross-sections of the buffer region, the first cross-section being thicker than the third cross-section and including a buried field plate, the second cross-section interposed between the first and third cross-sections and forming oblique angles with the first and third cross-sections. A barrier region is formed along the stepped lateral profile. The barrier region is separated from the buried field plate by a portion of the buffer region. The buffer region is formed from a first semiconductor material and the barrier region is formed from a second semiconductor material. The first and second semiconductor materials have different band-gaps such that an electrically conductive channel of a two-dimensional charge carrier gas arises at an interface between the buffer and barrier regions.

9 Claims, 12 Drawing Sheets

8B

(51) Int. Cl.
  *H01L 21/306* (2006.01)
  *H01L 29/06* (2006.01)
  *H01L 29/20* (2006.01)
  *H01L 29/205* (2006.01)
  *H01L 29/40* (2006.01)
  *H01L 29/66* (2006.01)
  *H01L 29/10* (2006.01)

(52) U.S. Cl.
  CPC .... *H01L 21/30621* (2013.01); *H01L 29/0657* (2013.01); *H01L 29/1075* (2013.01); *H01L 29/2003* (2013.01); *H01L 29/205* (2013.01); *H01L 29/407* (2013.01); *H01L 29/66462* (2013.01); *H01L 29/7786* (2013.01)

(58) Field of Classification Search
  CPC ........... H01L 29/0657; H01L 21/30612; H01L 29/2003; H01L 29/205; H01L 21/0254
  See application file for complete search history.

(56) References Cited

U.S. PATENT DOCUMENTS

| | | |
|---|---|---|
| 2007/0235775 A1 | 10/2007 | Wu et al. |
| 2008/0128752 A1 | 6/2008 | Wu |
| 2009/0065810 A1 | 3/2009 | Honea et al. |
| 2009/0146186 A1 | 6/2009 | Kub et al. |
| 2010/0025730 A1 | 2/2010 | Heikman et al. |
| 2010/0264462 A1 | 10/2010 | Hirler et al. |
| 2011/0095336 A1 | 4/2011 | Zundel et al. |
| 2012/0261720 A1 | 10/2012 | Puglisi et al. |
| 2013/0153967 A1* | 6/2013 | Curatola ............... H01L 29/407 257/194 |

FOREIGN PATENT DOCUMENTS

| | | |
|---|---|---|
| JP | 2007103451 A | 4/2007 |
| JP | 2008135575 A | 6/2008 |
| JP | 2011238701 A | 11/2011 |

* cited by examiner

HIGH-ELECTRON-MOBILITY TRANSISTOR HAVING A BURIED FIELD PLATE

TECHNICAL FIELD

The present invention generally relates to compound semiconductor transistors, and more particularly III-nitride based high-electron-mobility-transistors having buried field plates.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility Field Effect Transistor) also known as heterostructure FET (HFET) and modulation-doped FET (MODFET) have been used for various applications including, but not limited to use as switches in power supplies and power converters, electric cars, air-conditioners, and in consumer electronics, for example.

An HEMT is a field effect transistor with a junction between two materials having different band gaps, such as GaN and AlGaN. In a GaN/AlGaN based HEMT, a two-dimensional electron gas (2DEG) arises at the interface between the AlGaN barrier layer and the GaN buffer layer. The 2DEG forms the channel instead of a doped region such as in a MOSFET (metal oxide semiconductor field effect transistor). Similar principles may be utilized to select buffer and barrier layers that form a two-dimensional hole gas (2DHG) as the channel of the device. Without further measures, such a construction leads to a self-conducting, i.e., normally-on, transistor. That is, the HEMT conducts in the absence of a positive gate voltage.

One desirable attribute of transistors such as HEMTs is high breakdown voltage. An increased breakdown voltage allows a transistor to handle larger voltages associated with power switching applications, for example. To this end, conventional normally-on GaN-based HEMTs typically make use of a top field plate connected to the source terminal in order to lower the electric field peaks within the device, which in turn increases the breakdown voltage of the device. The top metal field plate is disposed above the gate electrode and insulated from the gate electrode by a dielectric material. The top metal field plate increases the breakdown voltage of the transistor by directing electric field lines away from the gate edge. However, the effectiveness of top-side metal field plates is limited because the field plate cannot be placed at very close distances to the most vulnerable areas of the gate electrode. It is desirable to have a more efficient field plate which increases the breakdown strength of a GaN HEMT by shaping the electric field in such a way to lower the maximum electric field peaks and to enhance the breakdown strength of the device.

SUMMARY

A method of forming a high-electron-mobility field effect transistor is disclosed. According to an embodiment, the method includes forming a buffer region having a stepped lateral profile and a buried field plate disposed therein. The stepped lateral profile includes first, second and third cross-sections of the buffer region. The first cross-section is thicker than the third cross-section and includes the buried field plate. The second cross-section is interposed between the first and third cross-sections and forms oblique angles with the first and third cross-sections. The method further includes forming a barrier region along the stepped lateral profile of the buffer region. The barrier region is separated from the buried field plate by a portion of the buffer region. The buffer region is formed from a first semiconductor material and the barrier region is formed from a second semiconductor material. The first and second semiconductor materials have different band-gaps such that an electrically conductive channel of a two-dimensional charge carrier gas arises at an interface between the buffer and barrier regions due to piezoelectric effects.

According to another embodiment, the method includes forming a buffer region comprising first, second and third cross-sections forming a stepped lateral profile. The first cross-section is thicker than the third cross-section and includes a buried field plate disposed therein. The second cross-section is interposed between the first and third cross-sections and forms oblique angles with the first and third cross-sections. The method further includes forming a barrier region of substantially uniform thickness along the stepped profile of the buffer region. The barrier region is separated from the buried field plate by a portion of the buffer region. The buffer region is formed from gallium nitride and the barrier region is formed from aluminum gallium nitride such that a two dimensional electron gas forms along the stepped lateral profile near an interface between the barrier region and the buffer region.

A high-electron-mobility semiconductor device is disclosed. According to an embodiment, the device includes a buffer region having first, second and third cross-sections forming a stepped lateral profile. The first cross-section is thicker than the third cross-section and includes a buried field plate disposed therein. The second cross-section is interposed between the first and third cross-sections and forms oblique angles with the first and third cross-sections. The device further includes a barrier region of substantially uniform thickness extending along the stepped lateral profile of the buffer region. The barrier region is separated from the buried field plate by a portion of the buffer region. The buffer region includes a first semiconductor material and the barrier region includes a second semiconductor material. The first and second semiconductor materials have different band-gaps such that an electrically conductive channel having a two-dimensional charge carrier gas arises at an interface between the buffer and barrier regions due to piezoelectric effects.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A-1B depicts a buffer region with a buried layer, according to an embodiment.

FIGS. 8A-8B depicts a high-electron-mobility field effect transistor having a stepped lateral profile, according to an embodiment.

DETAILED DESCRIPTION

Figure 1:
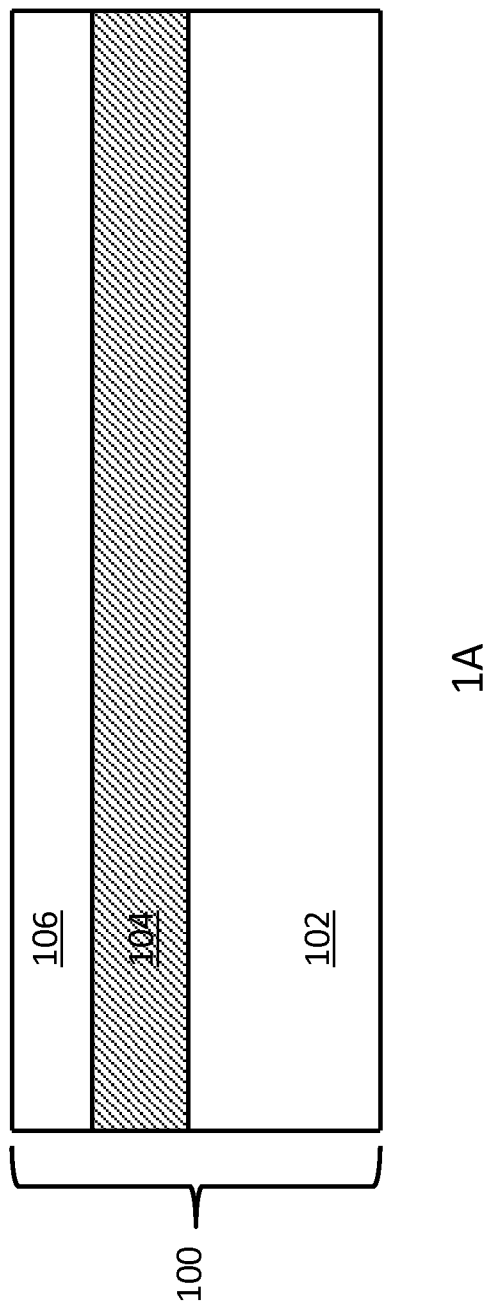
FIG. 1 including
Figure 1:
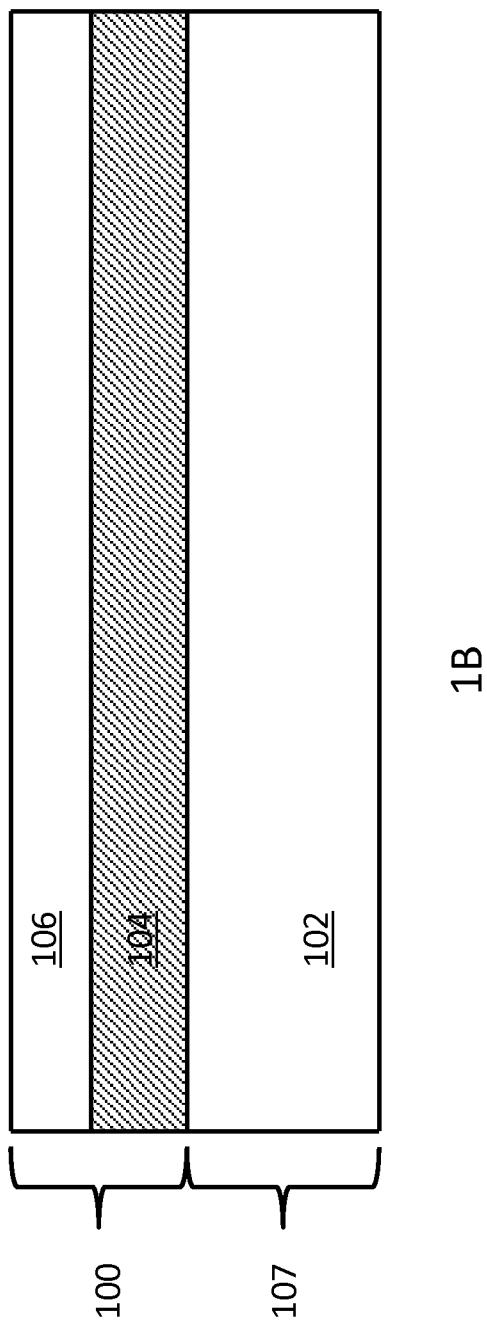

The term HEMT is also commonly referred to as HFET (heterostructure field effect transistor), MODFET (modulation-doped FET) and MESFET (metal semiconductor field effect transistor). The terms HEMT, HFET, MESFET and MODFET are used interchangeably herein to refer to any III-nitride based compound semiconductor transistor incorporating a junction between two materials with different band gaps (i.e., a heterojunction) as the channel. For example, GaN may be combined with AlGaN or InGaN to form an electron gas inversion region as the channel. The compound semiconductor device may have AlInN/AlN/GaN barrier/spacer/buffer layer structures. In general, the normally-off compound semiconductor transistor can be realized using any suitable III-nitride technology such as GaN that permits the formation of opposite polarity inversion regions due to piezoelectric effects.

Specifically with regard to GaN technology, the presence of polarization charges and strain effects in a GaN-based heterostructure body due to piezoelectric effects yield a two-dimensional charge carrier gas in the heterostructure body characterized by very high carrier density and carrier mobility. This two-dimensional charge carrier gas, such as a 2DEG (two-dimensional electron gas) or 2DHG (two-dimensional hole gas), forms the conductive channel of the HEMT near the interface between, e.g., a GaN alloy barrier region and a GaN buffer region. A thin, e.g. 1-2 nm, AlN layer can be provided between the GaN buffer region and the GaN alloy barrier region to minimize alloy scattering and enhance 2DEG mobility. In a broad sense, the compound semiconductor transistors described herein can be formed from any binary, ternary or quaternary III-nitride compound semiconductor material where piezoelectric effects are responsible for the device concept.

Embodiments described herein provide a high-electron-mobility field effect transistor and a corresponding method of forming said device. The high-electron-mobility field effect transistor includes a buffer region with a stepped lateral profile. That is, the buffer region includes thicker and thinner cross-sections separated by a gradual incline. A lateral surface of the buffer region along the stepped lateral profile has oblique (i.e., non-perpendicular) angles. This lateral surface is covered along the stepped lateral profile by a buffer region of substantially uniform thickness. The buffer and barrier regions are formed from two semiconductor materials with different band-gaps (e.g., GaN and AlGaN) such that a two-dimensional charge carrier gas forms near the interface of the barrier and buffer regions. Due to the oblique angles, the two-dimensional charge carrier gas is not substantially disrupted at the transition from the thicker to thinner cross-sections. Therefore, the two-dimensional charge carrier gas that extends along the stepped lateral profile forms an electrically conductive channel of the device, which is controllable by a gate structure.

Advantageously, the methods and devices described herein allow for the formation of a buried field plate in the thicker cross-section of the buffer region, directly underneath and close to a gate electrode formed on the barrier region. According to one embodiment, the buried field plate is formed by providing a buried doped layer in the buffer region. The buffer region is etched to form the stepped lateral profile and, as a result, a part of the buried doped layer is etched away. Subsequently, a relatively thin (e.g., 20 nm) layer of insulating buffer material is regrown. Thus, the layer that is used to form the buried field plate is covered by the thin layer of regrown material. Subsequently, a relatively thin (e.g., 20 nm) barrier layer is formed over the regrown buffer layer. Thus, the thicknesses of the regrown buffer material and the barrier layer represent all or a substantial majority of the distance between the buried field plate and the gate electrode.

Advantageously, the embodiments described herein reduce the expense and complexity of forming a buried field plate in an HEMT by using a doped layer of semiconductor material to form the buried field electrode. In general, doping of III-Nitride semiconductor materials such as GaN is difficult to control. Scattering mechanisms cause dopants (i.e., manganese) to disperse in the material. Thus, it may be difficult to contain the doped region to a well-defined field plate area within the semiconductor material. In that case, the scattering mechanisms lead to a substantial risk of electrical short between the field plate and the two-dimensional charge carrier gas (i.e., the channel of the device). Embodiments described herein substantially mitigate or eliminate this risk of electrical short by forming a complete doped layer in the material, etching away a lateral portion of the doped layer that is not needed for the field electrode, and regrowing an insulating layer of buffer material (e.g., undoped GaN) over the exposed end of the doped layer. The scattering mechanisms are not present in the regrown layer. Thus, the remaining portion of the doped layer may be used to form a field plate, and this field plate is separated from the two-dimensional charge carrier gas by an electrically stable buffer region. That is, there is little to no risk of electrical short between the field plate and the two-dimensional charge carrier gas.

Referring to FIG. 1A, a buffer region 100 that may be used to form a high-electron-mobility field effect transistor is depicted. The buffer region 100 includes an electrically insulating first layer 102. The buffer region 100 further includes a second layer 104 formed along and directly adjoining the first layer 102. Optionally, the buffer region 100 can be formed with an electrically insulating further layer 106 formed along the second layer 104.

The first layer 102 may formed from intrinsic (i.e., unintentionally doped) GaN. Alternatively, this first layer 102 may be formed from GaN material that has been compensated with dopants, such as carbon. This compensation may be done to provide a buffer region 100 having high breakdown voltage and low leakage currents.

FIG. 1B depicts an alternate embodiment in which the first layer 102 is formed as a backbarrier region 107. For example, the first layer 102 may be completely or partially formed from AlGaN. In one embodiment, the first layer is a layer of $Al_xGa(1-x)N$ (with x=4%). Furthermore, the first layer 102 may be a compound structure formed from more than one material.

According to an embodiment, the second layer 104 is an electrically conductive layer. For example, the second layer may be a p-type layer of GaN. Alternatively, the second layer 104 may be an electrically insulating layer that may be etched selective to the rest of the material in the buffer region 100. For example, the second layer 104 may be a layer of AlGaN.

The further layer 106 may be formed from the same semiconductor material as the first layer 102. For example, the further layer 106 may be formed from intrinsic or compensated GaN.

The buffer region 100 of FIG. 1 may be formed using epitaxial growth techniques. For example, the buffer region 100 may be formed by a metal-organic chemical vapor deposition (MOCVD) process. According to an embodiment, the buffer region 100 is formed by first growing the first layer 102 as a layer of GaN in an epitaxial process. Subsequently, the second layer 104 is epitaxially grown on the first layer 102. The second layer 104 may be formed as a layer of p-type GaN by growing dopants such as manganese into the GaN material during this epitaxial step. Subsequently, an optional further layer 106 of GaN may be epitaxially grown on the second layer 104. Alternatively, the buffer region 100 of FIG. 1 may be formed by providing a substrate of insulating GaN material and introducing dopants at a surface of the substrate (e.g., using ion implantation) to form the second layer 104 as a buried conductive doped layer.

Figure 2:
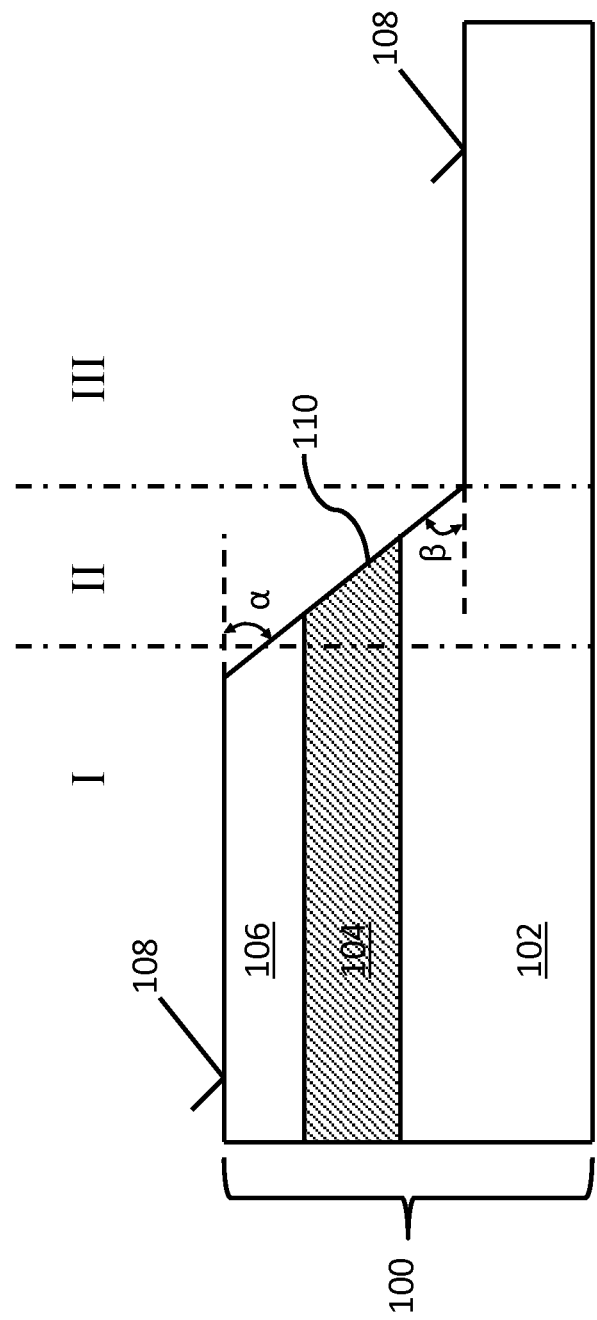
FIG. 2 depicts the formation of a stepped lateral profile in the buffer region of FIG. 1, according to an embodiment.

Referring to FIG. 2, a portion of the buffer region 100 is removed so that the buffer region 100 has a stepped lateral profile. The stepped lateral profile includes first, second and third cross-sections I, II, III of the buffer region 100. The first cross-section I is thicker than the third cross-section III. The second cross-section II is interposed between the first and third cross-sections I, III and forms oblique (i.e., non-perpendicular) angles α, β with the first and third cross-sections I, III.

As used herein, the term stepped lateral profile refers to an orientation of the planes of a region of semiconductor material (e.g., the buffer region 100) along a lateral surface of this region. The lateral surface of a stepped lateral profile includes two different planes that are parallel but vertically spaced apart from one another. Further, an inclined plane (i.e., plane non-perpendicular to the other planes) may extend between the two different planes so as to form a sloped transition. For example, as shown in FIG. 2, a lateral surface 108 of the buffer region 100 in the first cross-section I (i.e., the thicker cross-section) is substantially parallel to the lateral surface 108 of the buffer region 100 in the third cross-section III (i.e., the thinner cross-section). The lateral surface 108 of the buffer region 100 in the second cross-section II is inclined such that the second cross-section II forms a gradually thinning transition from the thicker cross-section to the thinner cross-section. As a result, the lateral surface 108 includes oblique angles α, β at the transitions between the cross-sections.

According to an embodiment, a first angle α at the lateral surface 108 of the buffer region 100 at the transition between the first and second cross-sections I, II is between twenty and seventy degrees and a second angle β at the lateral surface 108 of the buffer region 100 at the transition between the second and third cross-sections II, III is between twenty and seventy degrees. If the lateral surfaces 108 in the first and third cross sections I, III are parallel to one another, the first angle α is equal to the second angle β. According to an embodiment, both of the first and second angles α, β are forty-five degrees.

The stepped lateral profile depicted in FIG. 2 may be formed from the buffer region 100 of FIG. 1 using masked etching techniques, for example. According to an embodiment, the stepped lateral profile is formed by providing an etch-resistant mask over the first cross-section I and wet-chemically etching portions of the buffer region 100 that are exposed by the mask.

According to an embodiment, the buffer region 100 is etched so that a lateral portion of the second layer 104 is removed. If the optional further layer 106 of GaN is provided in the buffer region 100, the further layer 106 and the second layer 104 may be removed by a common etch process. Alternatively, the two layers may be etched separately. According to an embodiment, the etching process is an isotropic plasma etching process. As a result of the etching, an end 110 of the second layer 104 is exposed in the second cross-section II.

Figure 3:
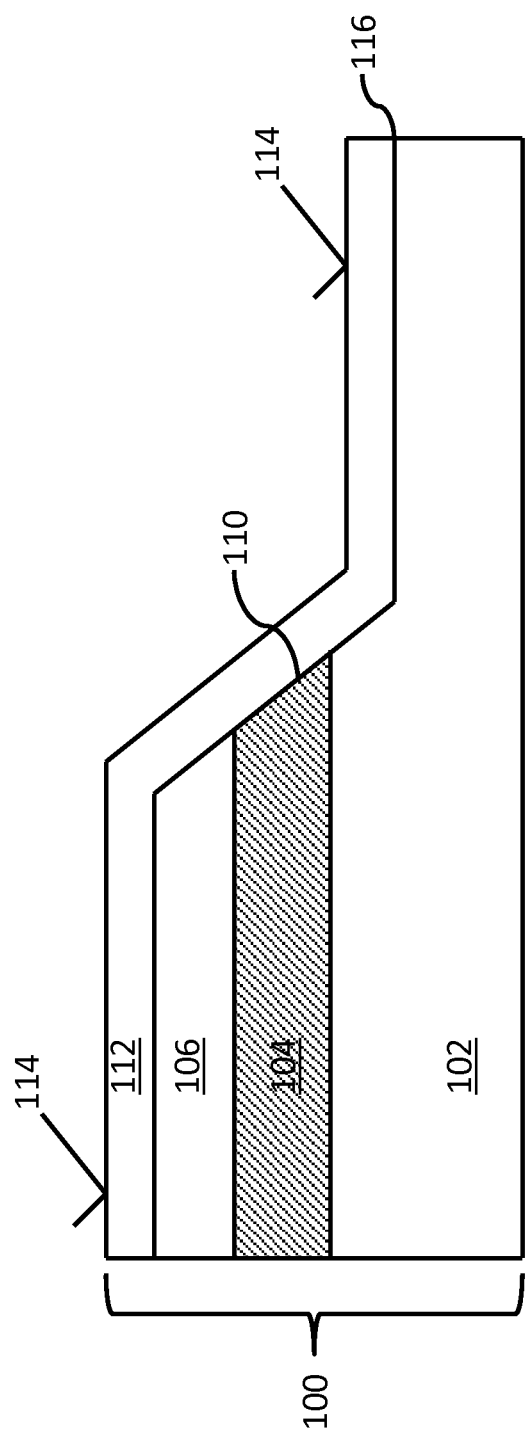
FIG. 3 depicts the formation of an insulating layer of buffer material along the stepped lateral profile, according to an embodiment.

Referring to FIG. 3, a third insulating layer 112 is formed in the buffer region. According to an embodiment, the third layer 112 is formed by regrowing GaN material using an epitaxial process. According to an embodiment, the third layer 112 is formed as an intrinsic layer of GaN material. The third layer 112 covers the exposed end 110 of the second layer 104 with insulating GaN material. The epitaxial process may be substantially similar or identical to the epitaxial process used to form the first layer 102, for example. According to an embodiment, the third layer 112 is regrown along the entire stepped lateral profile of the buffer region 100. The third layer 112 may be substantially uniform in thickness. For example, the third layer 112 may be between 15 and 200 nm thick. According to an embodiment, the third layer 112 is approximately 20 nm thick. As a result of this substantially uniform thickness, the buffer region 100 retains the stepped lateral profile at a newly formed lateral surface 114.

In FIG. 3, a boundary line 116 between the third layer 112 of GaN material and the rest of the buffer region 100 is shown for the purpose of illustrating how the third layer 112 is formed, and does not necessarily indicate any difference in the crystalline structure of the semiconductor material. Those of ordinary skill will appreciate that epitaxial growth processes are carried out so that a crystalline structure of the epitaxially grown layer is a perfect or near perfect replica of the crystalline structure of the subjacent material. Thus, the GaN material in the third layer 112 may be indistinguishable from the subjacent GaN material of the first layer 102 and/or the further layer 106 insofar as the crystalline structure of the third layer 112 is concerned.

Advantageously, by regrowing the third layer 112 after doping the second layer 104 (in the case that the second layer 104 is a layer of p-type GaN) the scattering mechanisms associated with the doping process do not compromise the third layer 112. That is, the third layer 112 forms an electrically stable portion of the buffer region 100 that is not prone to electrical short with the second layer 104. To this end, the optional process step of forming the further layer 106 as an insulating GaN layer after forming the second layer 104 serves to ensure that the third layer 112 remains free of acceptors, as the memory effects of the epitaxial growth process are mitigated.

Figure 4:
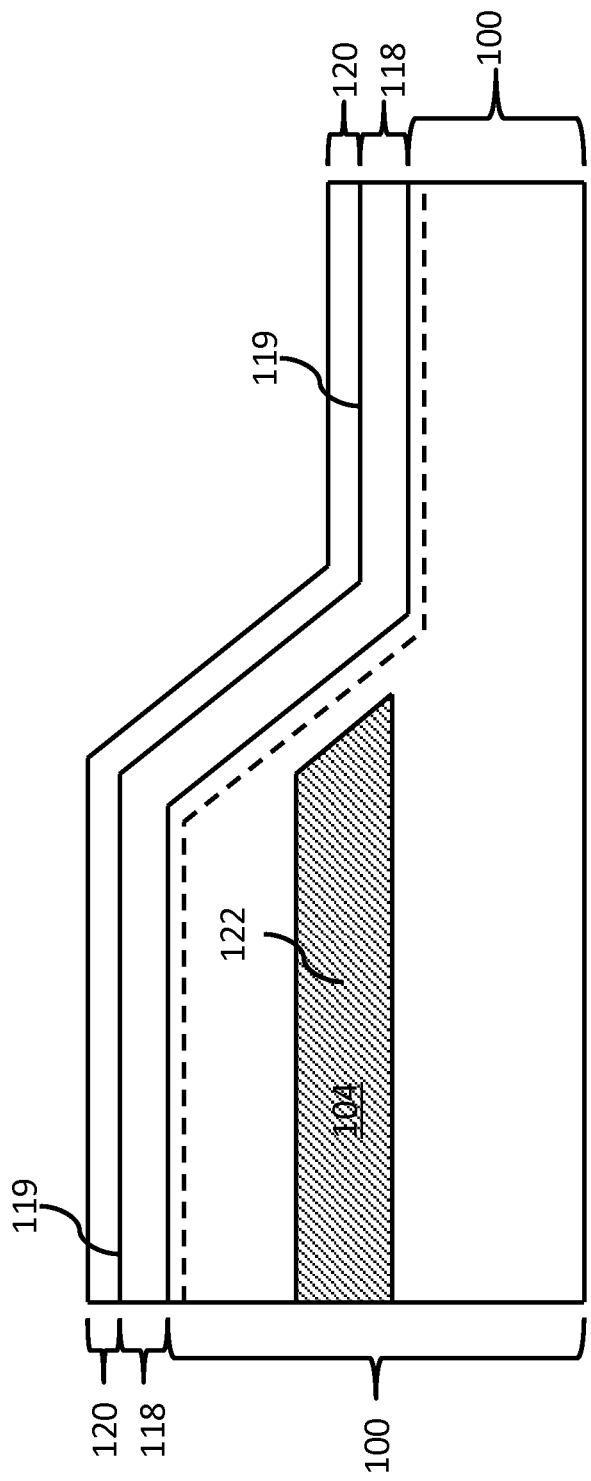
FIG. 4 depicts the formation of a barrier region along the insulating layer of buffer material to form a hetero structure, according to an embodiment.

Referring to FIG. 4, a barrier region 118 is formed on the buffer region 100. The boundary line 116 between the third layer 112 of GaN material and the rest of the buffer region 100 depicted in FIG. 3 is omitted for the sake of clarity. The barrier region 118 may be formed as a fourth layer of GaN material having a different bandgap as the semiconductor material of the buffer region 100. As a result, an electrically conductive channel of a two-dimensional electrons gas (2DEG) arises at an interface between the buffer and barrier regions 110, 118 due to piezoelectric effects. In FIG. 4, the 2DEG is represented by a dashed line. This 2DEG is separated and electrically insulated from the second layer 104 by the regrown third layer 112 of GaN (depicted in FIG. 3).

According to an embodiment, the barrier region 118 is a layer of AlGaN having substantially uniform thickness along the stepped lateral profile. For example, the barrier region 118 may be a layer of AlGaN between 10 and 200 nm thick. According to an embodiment, the barrier region 118 is approximately 25 nm thick. The aluminum content of the barrier region 118 may be approximately 20 percent, for example. The barrier region 118 may be formed by an epitaxial growth process that is common to the formation of the third layer 112. As a result, the device retains the stepped lateral profile at a newly formed lateral surface 119 of the barrier region 118.

According to an embodiment, a capping layer 120 is formed on the barrier region 118. The capping layer 120 may be formed as a fifth layer of GaN material that is substantially similar or identical to the GaN material of the third layer 112. According to an embodiment, the capping layer 120 is formed a layer of intrinsic GaN material by an epitaxial growth process. The capping layer 120 may be 2-3 nm thick, for example.

The method steps disclosed in FIGS. 1-4 provide a heterostructure that may be used as the basis of a high-electron-mobility field effect transistor. In the heterostructure, a 2DEG arises at the heterojunction between the barrier and buffer regions 100, 118. The heterostructure can be formed in such a way that the 2DEG arising at or near the heterojunction is electrically conductive throughout the stepped lateral profile. That is, the 2DEG extends along the different planes of the buffer and barrier regions 100, 118 and includes oblique angles α, β previously discussed. The density of carriers in the 2DEG is influenced by the presence of polarization charges along crystal orientations at the heterojunction. Thus, if a heterostructure is formed with a steep gradient (or a perpendicular sidewall) between thicker and thinner regions, the 2DEG will disappear and the heterojunction will cease to be electrically conductive in a transition region between the thicker and thinner cross-sections. However, if the heterostructure includes a gradual slope between the thicker and thinner cross-sections, the 2DEG remains along the entire stepped lateral profile. Although the sloping of the heterostructure may reduce the density of carriers of the 2DEG at or near the heterojunction (and consequently degrade the conductivity of the channel) to an extent, the 2DEG may nonetheless be highly conductive and suitable in many applications.

The second doped layer 104 is used to form a buried field plate 122 disposed within the buffer region 100 of the heterostructure. According to an embodiment, the buried field plate 122 is formed from p-type GaN material. One advantage of forming the buried field plate 122 from p-type GaN material is that the p-type GaN material will absorb holes that are freed, e.g., by impact ionization effects, and thus improves the reliability of the device.

In the embodiments in which the second layer 104 is p-type GaN, the buried field plate 122 may be formed from a lateral section of the second layer 104 that remains intact after etching. In other words, the methods described herein allow for the formation of a buried field plate 122 of p-type GaN by forming a complete p-type GaN layer in the buffer region 100 and by removing a section of the p-type GaN layer where the buried field plate 122 is not needed. Advantageously, the barrier region 118 is separated from the buried field plate 122 by an insulating portion of the buffer region 100 corresponding to the third layer 112 (as illustrated in FIG. 3). Thus, the buried field plate 122 may be separated from the barrier region 118 and the 2DEG by a thin layer of insulating GaN material. Because third layer 112 may be a GaN layer that is regrown after forming the second layer 104 as p-type GaN, there is little risk of electrical short between the buried field plate 122 and the 2DEG for the reasons previously discussed.

Figure 5:
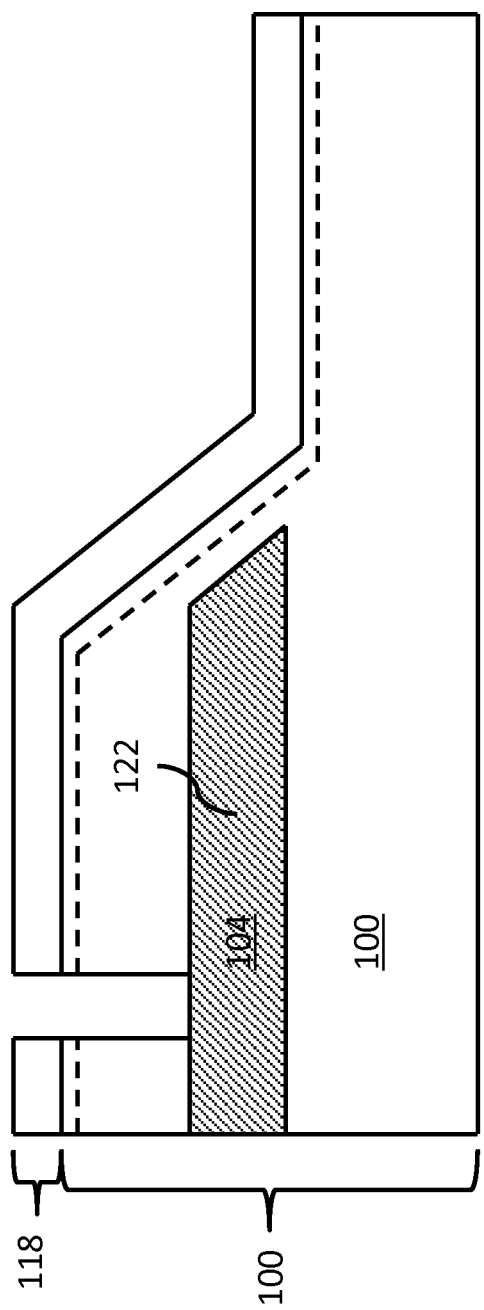
FIG. 5 depicts a method of forming an electrically conductive electrode in the heterostructure of the FIG. 4, according to an embodiment.
Figure 6:
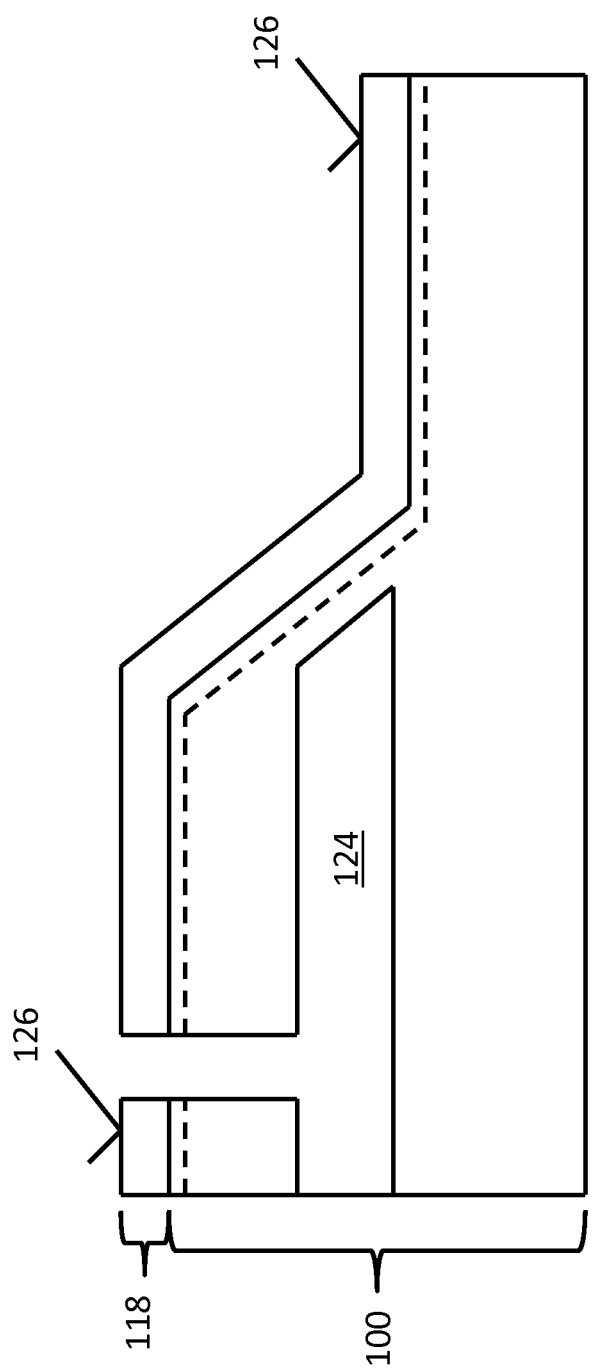
FIG. 6 depicts selective etching of material formed within the buffer region to form a buried field plate trench, according to an embodiment.
Figure 7:
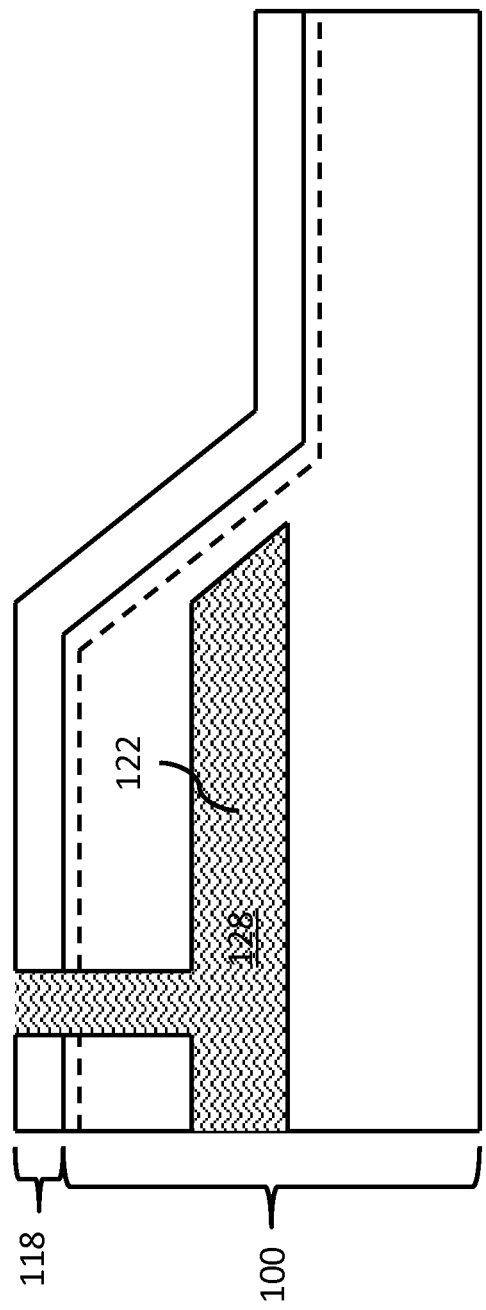
FIG. 7 depicts filling the buried field plate trench with an electrically conductive material, according to an embodiment.

FIGS. 5-7 depict an alternate method of forming the buried field plate 122 disposed within the buffer region 100 of the heterostructure. In this embodiment, the second layer 104 is configured to be etched selective to the surrounding semiconductor material of the buffer region. For example, the second layer 104 may be a layer of AlGaN with an aluminum content chosen such that the AlGaN can be wet chemically removed (e.g., by heated phosphoric acid) selective to GaN in the buffer region 100.

As shown in FIG. 5, the heterostructure including the barrier region 118 and the buffer region 100 is etched in the first cross-section I so as to expose the second layer 104. This etching process may be a dry etching process, for example. Further, this etching process may be an anisotropic etching process, for example.

As shown in FIG. 6, the second layer 104 is etched selective to the buffer region 100 so as to form a buried trench 124 in the buffer region 100. This buried trench 124 is accessible from an outer surface 126 of the heterostructure via the etching of the barrier and buffer regions 100, 118 discussed with reference to FIG. 5.

As shown in FIG. 7, the buried trench 124 is filled with an electrically conductive material 128. According to an embodiment, the electrically conductive material 128 is a metal, such as titanium nitride (TiN). The titanium nitride may be formed by atomic layer deposition, for example.

The sequence of process steps shown in FIGS. 5-7 may produce a buried field plate 122 having a substantially similar or identical geometry as the buried field plate 122 formed from the p-type GaN of the second layer 104 discussed with reference to FIG. 5. This is because AlGaN, which may be provided as the second layer 104, can be etched selective to GaN, which may be used as the buffer region 100, with a high-degree of precision. Thus, the buried trench 124 has a substantially similar or identical geometry as the lateral section of the second layer 104 that remains intact after etching.

Referring to FIG. 8A, a high-electron-mobility field effect transistor 200 that may be formed according to the methods described herein is depicted, according to an embodiment. The transistor 200 may be formed on a heterostructure with barrier and buffer regions 100, 118 that are produced according to the methods described with reference to FIGS. 1-7. The transistor 200 includes a 2DEG that arises at the interface between the buffer and barrier regions 100, 118 due to piezoelectric effects. The 2DEG forms the channel 202 of the device.

Figure 8:
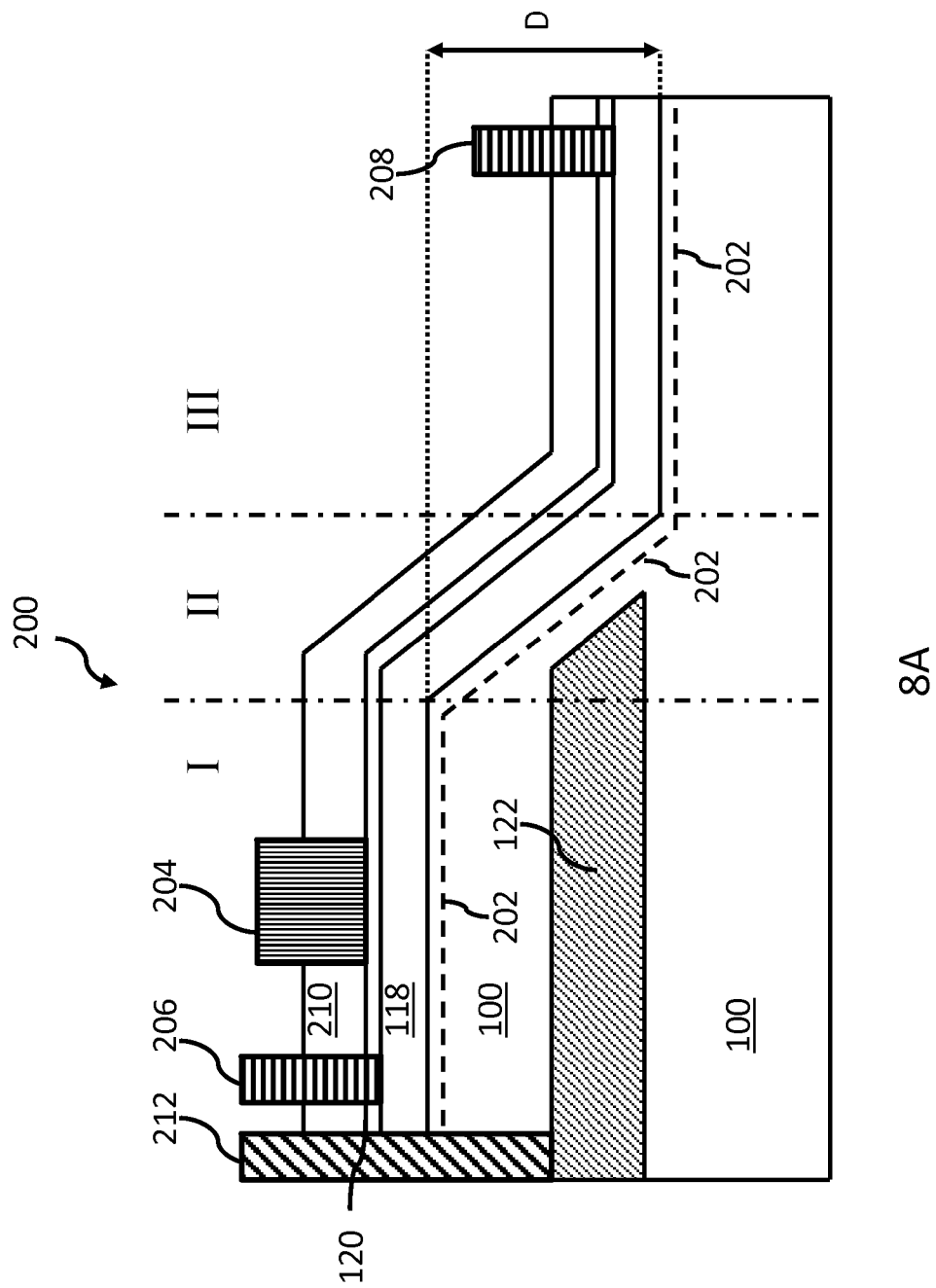
FIG. 8 including

The transistor 200 includes a gate electrode 204 that is formed on the first cross-section I over the buried field plate 122. The gate electrode 202 is spaced apart from the channel 202 by the barrier region 118. According to an embodiment, the gate electrode 202 is also spaced apart from the channel 202 by the capping layer 120, which may be an intrinsic layer of GaN. Alternatively, the gate electrode 202 may be insulated from the channel by a dielectric (e.g., by a portion of the passivation layer 210 or other dielectric material) to form a MISFET device. The transistor 200 further includes a source electrode 206 that is formed on the first cross-section. The source electrode 206 is in ohmic contact with the channel 202. The transistor 200 further includes a drain electrode 208 formed outside of the first and second cross-sections I, II. In the embodiment of FIG. 8, the drain electrode 208 is formed on the third cross-section III. The drain electrode 208 is in ohmic contact with the channel 202. Optionally, the transistor 200 can include a passivation layer 210 along the stepped lateral profile to protect the surface of the transistor 200. The passivation layer 210 may be formed from an electrically insulating material such as a silicon nitride or a silicon oxide, for example.

Figure 8B:
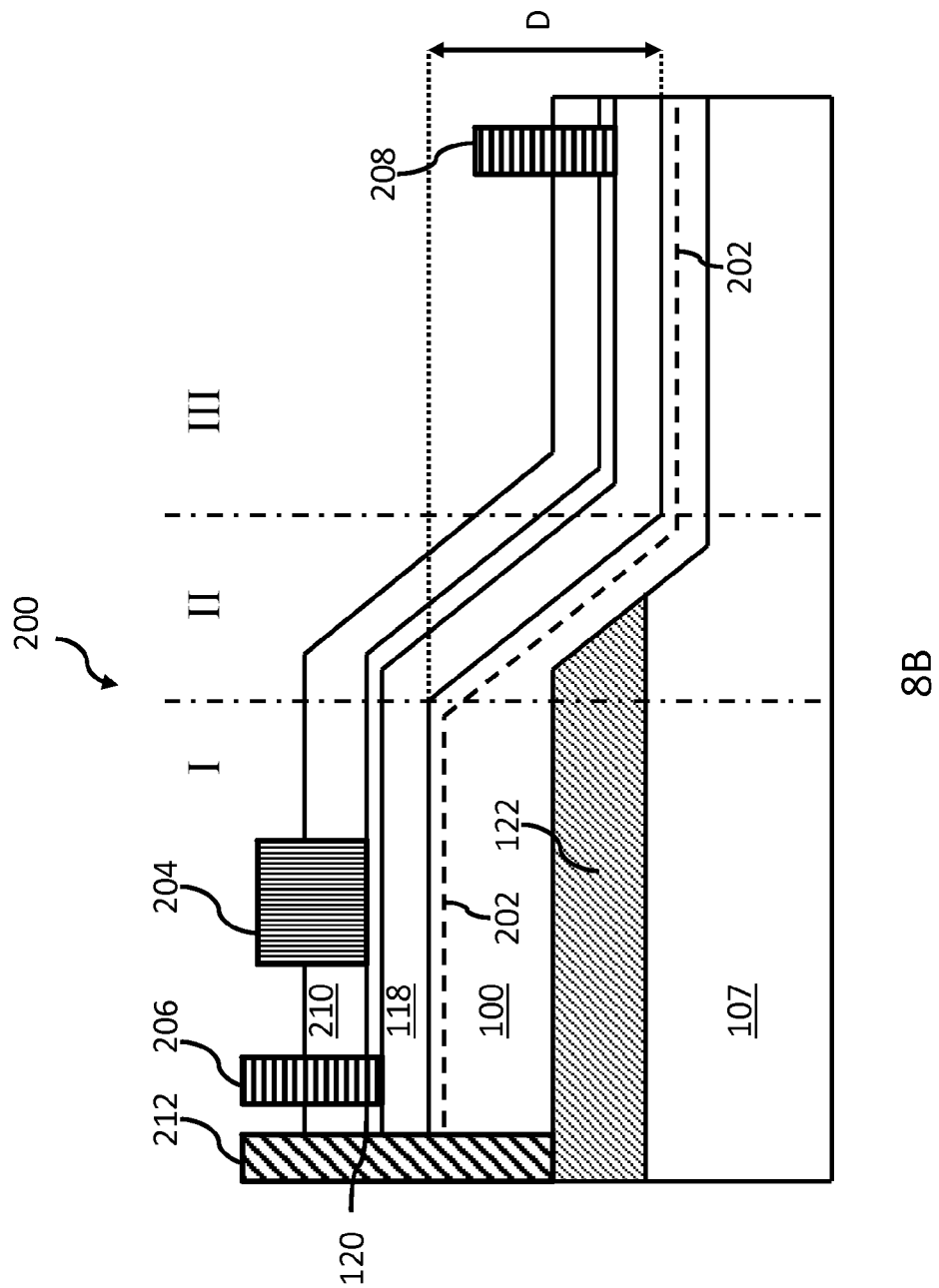

FIG. 8B depicts an embodiment in which the transistor 200 includes a backbarrier region 107. The backbarrier region 107 may be formed from AlGaN material as part of the first layer 102 described with reference to FIG. 1B. The backbarrier region 107 is arranged opposite to the barrier region 118 and is insulated from the two-dimensional charge carrier gas by the buffer region 100. In this embodiment, the buffer region 100 includes the regrown GaN material of the fourth layer 112 and the optional further layer 106 depicted in FIG. 3.

In a commonly known manner, the transistor 200 is configured to control an electrical current flowing between the source and drain electrodes 206, 208. For example, the transistor 200 may be a normally-on device in which an electrical current flows between the source and drain electrodes 206, 208 that are biased in the absence of any gate potential. A bias applied to the gate electrode 204 locally disrupts the 2DEG underneath the electrode 204 and thus turns the device off. Alternatively, transistor 200 may be configured as a normally-off device. For example, the gate of the transistor 200 may include a doped region within or underneath the gate electrode 204 to disrupt the 2DEG underneath the gate in the absence of a gate voltage.

The channel 202 of the transistor 200 follows the stepped lateral profile of the buffer region 100. However, this stepped lateral profile is not necessarily as dramatic as depicted in the figures. For example, the vertical distance (D) between parallel lateral surfaces of the buffer region 100 in the first-cross-section I and third cross-section III may be in the range of 100-200 nm. In other words, the thinner portion of the transistor 200 may be vertically offset from the thicker portion by no more than 100-200 nm. By contrast, the gate and drain electrodes 204, 208 may be spaced apart from one another by a lateral distance of 12 microns, for example. Thus, the degree of vertical offset in the channel 202 of the device relative to the overall size of the device may be minimal. Consequently, the degree of vertical offset does not substantially degrade the mobility of carriers in the channel 202.

The field plate 122 of the transistor 200 may be formed from p-type GaN material corresponding to the lateral section of the second layer 104 that is not etched, as discussed with reference to FIG. 4. Alternatively, the field plate 122 may be an electrical conductor, such as TiN, that is formed according to the methods discussed with reference to FIGS. 5-7. In either case, the transistor includes a first field plate electrode 212 extending through the barrier and buffer regions 100, 118. In the event that the field plate 122 is formed from p-type GaN corresponding to the lateral section of the second layer 104 that is not etched material, the first field plate electrode 212 may be formed by etching (e.g., using a dry anisotropic etching process) the barrier and buffer regions 100, 118 and forming doped conductive semiconductor material (e.g., p-type or n-type silicon) in the etched trenches. Alternatively, the first field plate electrode 212 may be an electrical conductor. Further, the first field plate electrode 212 may be part of a continuous structure formed according to the methods discussed with reference to FIGS. 5-7.

Advantageously, the buried field plate 122 is spaced closely to the gate electrode 202. The distance separating the buried field plate 122 from the gate electrode has a close correlation to the thickness of the regrown third layer 112 of the buffer region 110 and the fourth layer that forms the barrier region 118. According to an embodiment, the buried field plate 122 is separated from the gate electrode by a distance of 40 nm, which corresponds to a combined thickness of the third layer 112 and the barrier region 118. For example, the third layer 112 may be a GaN layer of 20 nm and the barrier region 118 may be an AlGaN layer of 20 nm.

Figure 9:
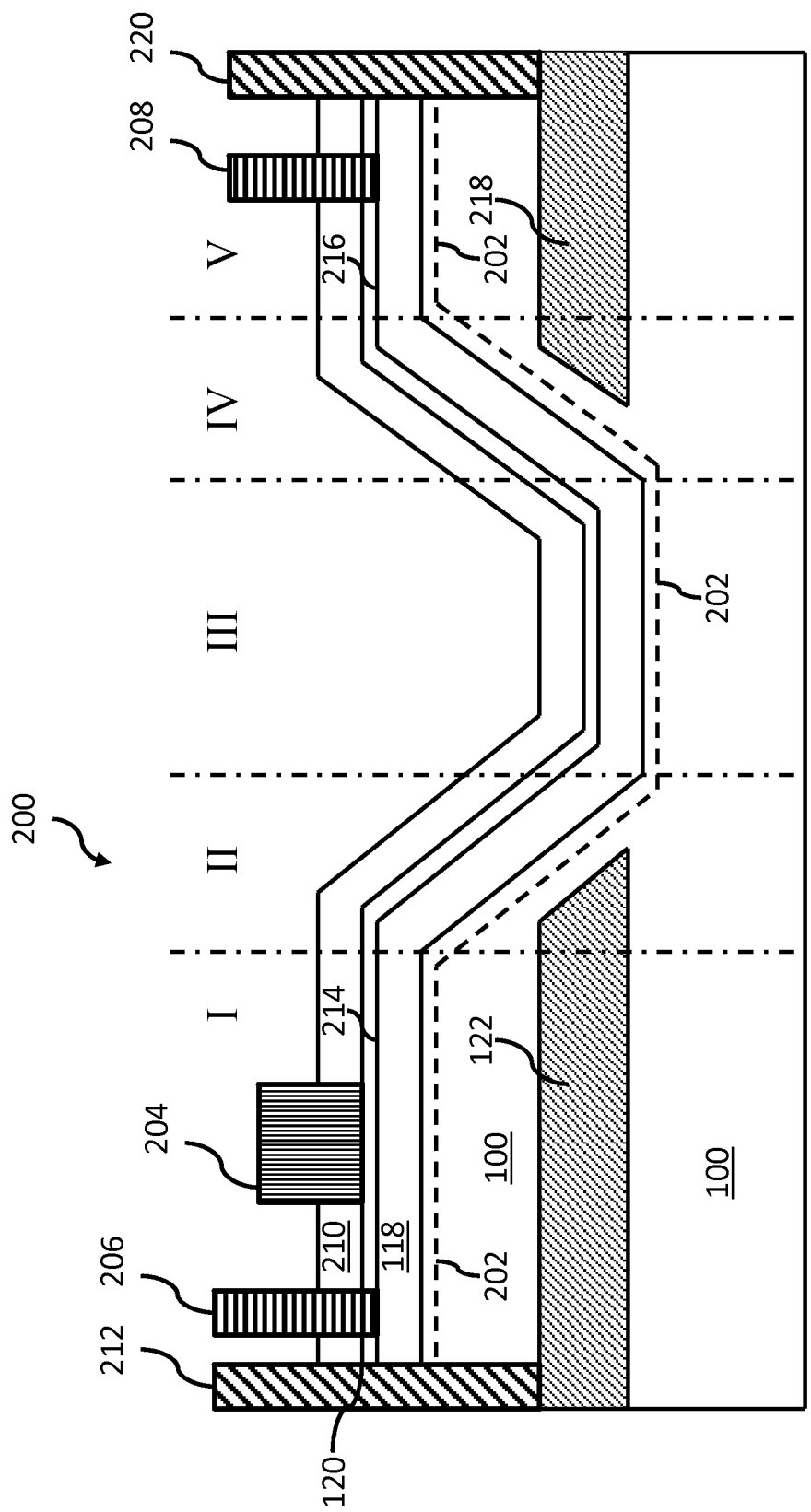
FIG. 9 depicts a high-electron-mobility field effect transistor having a stepped lateral profile, according to another embodiment.

Referring to FIG. 9, a high-electron-mobility field effect transistor 200 is depicted, according to another embodiment. In the transistor 200 of FIG. 8, the source electrode 206 is arranged on the first cross-section I and the drain electrode 208 is arranged on the third cross-section III. Thus, the source and drain electrodes 204, 208 in the device of FIG. 8 are vertically offset from one another. This configuration requires forming the source and drain electrodes 204, 208 on two different lateral planes, which may result increase the expense and complexity of device fabrication. By forming the source and drain electrodes 204, 208 along the same lateral plane as shown in FIG. 9, the expense and complexity of the contact formation process, and consequently the device fabrication process, may be reduced.

In the device of claim 9, the buffer region 100 has been formed with a stepped lateral profile including fourth and fifth cross-sections IV, V of different thickness. The fifth cross-section V is substantially equal or identical in thickness to the first cross-section I. The fourth cross-section IV is interposed between the fifth and third cross-sections V, III and forms oblique angles with the fifth and third cross-sections V, III. According to an embodiment, the fourth and fifth cross-sections IV, V form a mirror image of the first and second cross-section I, II, relative to a vertical axis extending through the third cross section. A buffer region 100 having the stepped lateral profile including the fourth and fifth cross-sections IV, V as depicted in FIG. 9 may be formed by performing the process steps previously discussed with reference to FIGS. 1-4, wherein the masked etching technique discussed with reference to FIG. 2 is performed so that two lateral sides of the buffer region 100 (corresponding to the first and fifth cross-sections I, V) are covered by the mask. In other words, material is only removed at a center of the buffer region 100. According to an embodiment, the first and fifth cross-sections I, V extend to edge sides of a semiconductor substrate.

The stepped lateral profile includes two lateral surfaces 214, 216 corresponding to the first and fifth cross-sections I, IV that are vertically aligned with one another. Thus, the source electrode 206 of the transistor 200 may be arranged on the first cross-section I and the drain electrode 208 of the transistor 200 may be arranged on the fifth cross section V such that these electrodes 206, 208 adjoin the barrier region 118 along the same lateral plane.

The device of FIG. 9 additionally includes a second buried field plate 218 in the fifth cross-section and spaced apart from the barrier region 118 by portion of the buffer region 100. Electrical contact with the second buried field plate 218 may be effectuated by a second field plate electrode 220 extending through the barrier and buffer regions 100, 118 and being in ohmic contact with the field plate. The second buried field plate 218 and the second field plate electrode 220 may be formed by similar or identical methods as those methods used to form the first buried field plate 122 and first field plate electrode 212, respectively. For example, the second buried field plate 218 may be formed from a lateral portion of p-type GaN that is used to form the second layer 104 that remains intact after etching, for example. The second field plate electrode 220 may be formed by etching a trench in the barrier and buffer regions 100, 118 and forming doped conductive semiconductor material (e.g., p-type or n-type silicon) in the etched trenches, for example.

The second buried field plate 218 may be configured as a drain-side field plate of the device. This drain-side field plate 218 may be used to direct electric field lines away from the drain contact 208 (e.g., by biasing this field plate 218) and consequently improve the reliability of the device.

Figure 10:
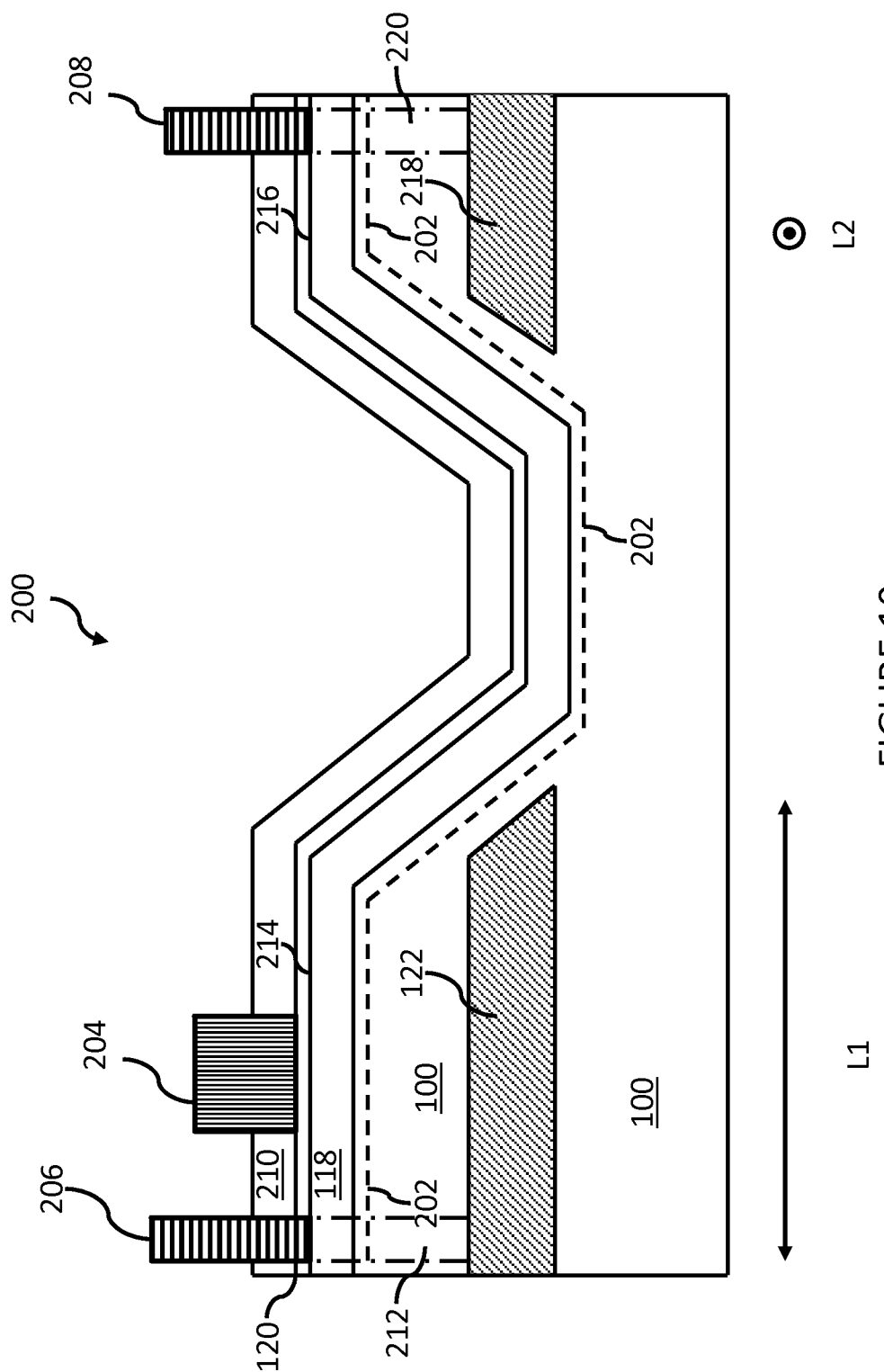
FIG. 10 depicts a high-electron-mobility field effect transistor having a stepped lateral profile, according to another embodiment.

Referring to FIG. 10, another embodiment of a high-electron-mobility field effect transistor 200 is depicted. In the embodiment of FIG. 10, the source electrode 206 and the first field plate electrode 212 overlap in the first cross-section I, and the drain electrode 208 and the second field plate electrode 220 overlap in the fifth cross-section V. By overlapping the source and drain electrodes 206, 208 with the first and second field plate electrodes, 212, 220 respectively, the lateral space occupied by the transistor 200 can be reduced.

According to an embodiment, the overlap configuration of FIG. 10 is achieved by a lateral arrangement of the respective electrodes 212, 220. The 2DEG depicted in FIG. 10 extends in two lateral directions: a first lateral direction L1 that extends between the source and drain electrodes 206, 208, and a second lateral direction L2 orthogonal to the first lateral direction L1. The source electrode 206 may be offset from the first field plate electrode 212 in the second lateral direction L2 and be in ohmic contact with the 2DEG. FIG. 10 depicts a cross-section of the device in the first lateral direction that intersects the source electrode 206. A silhouette of the first field plate electrode 212 in another cross-section is shown as well. The drain electrode 208 and the second field plate electrode 220 may be may be offset from one another in the second lateral direction L2 in a corresponding manner.

According to an embodiment, the overlap configuration of FIG. 10 is achieved by combining the source electrode 206 with the first field plate electrode 212. That is, the source 206 electrode and the first field plate electrode 212 are formed in the same trench such that a single conductive structure formed within this trench is in ohmic contact with both the 2DEG and the first buried field plate 122. According to an embodiment, the conductive structure that forms both the source electrode 206 and first field plate electrode 212 may include n-type and/or p-type silicon. Alternatively, the conductive structure that forms both the source electrode 206 and first field plate electrode 212 is an electrically conductive metal, such as such as TiN.

Embodiments described in this specification pertain to, without being limited thereto, heterojunction semiconductor devices, in particular to high-electron-mobility field effect transistors, and to manufacturing methods therefor. The term "heterojunction" as used in this specification describes an interface between two layers or regions of a semiconductor material with different crystal structure. These semiconducting materials have typically different band gaps.

In the above described embodiments, the heterojunction includes a buffer region formed from GaN material and a barrier region formed from AlGaN material. These materials are only used as examples, and any may be substituted with any of a variety of heterojunction semiconductor materials. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. Further, the 2DEG that arises between GaN and AlGaN may alternatively be a two-dimensional hole gas if the materials used for the barrier and buffer regions are appropriately selected.

The term "insulating" as used in this specification describes a layer or region of in which the free charges have low mobility or no mobility. An insulating layer or region of semiconductor material may be completely free of dopants, or may include a low concentration of p-type or n-type dopants, due to impurities naturally arising in the semiconductor material. Furthermore, insulating layer or region of semiconductor material may be intentionally doped with a compensating dopant, such as carbon (C) or iron (Fe), to neutralize naturally occurring p-type or n-type dopants.

Within this specification the terms "in low resistive electric contact," "electrically coupled," "in low ohmic contact," and "in low resistive electric connection" are used synonymously. Likewise, the terms "in resistive electric contact," "in ohmic contact," and "in resistive electric connection" are used synonymously within this specification.

Spatially relative terms such as "under," "below," "lower," "over," "upper," "above," "beneath" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a high-electron-mobility field effect transistor, the method comprising:
forming a buffer region having a stepped lateral profile, the stepped lateral profile comprising first, second and third cross-sections of the buffer region, the first cross-section being thicker than the third cross-section, the second cross-section interposed between the first and third cross-sections and forming oblique angles with the first and third cross-sections; and
forming a buried field plate within the first cross section of the buffer region,
forming a barrier region along the stepped lateral profile of the buffer region, the barrier region separated from the buried field plate by a portion of the buffer region,
wherein the buffer region is formed from a first semiconductor material and the barrier region is formed from a second semiconductor material, the first and second semiconductor materials having different band-gaps such that an electrically conductive channel comprising a two-dimensional charge carrier gas arises at an interface between the buffer and barrier regions due to piezoelectric effects,
wherein the buffer region is formed by an epitaxial growth process, and
wherein forming the buried field plate comprises epitaxially growing a second layer of the first or second semiconductor material on a first layer of the first semiconductor material as part of the buffer region,
wherein forming the buffer region and the buried field plate comprises:
growing the first layer of the first semiconductor material;
growing the second layer of the first or second semiconductor material on the first layer;
etching semiconductor material from the first and second layers to form the stepped lateral profile; and
regrowing a third layer of the first semiconductor material along the stepped lateral profile; and
wherein etching semiconductor material comprises removing a lateral portion of the second layer aerial so as to expose an end of the second layer material, wherein regrowing the third layer comprises covering the exposed end of the second layer with regrown first semiconductor material, and wherein forming the barrier region comprises growing a fourth layer of the second semiconductor material over the third layer such that the two-dimensional charge carrier gas is separate from the buried field plate by the regrown third layer of the first semiconductor material.

2. The method of claim 1, wherein the second layer is a doped conductive layer of the first semiconductor material, and wherein the buried field plate comprises a lateral section of the second layer that remains intact after etching.

3. The method of claim 1, wherein the second layer is a layer of the second semiconductor material that is configured to be etched selective to the first semiconductor material, and wherein the buried field plate is formed by:
etching the barrier region and the buffer region in the first cross-section so as to expose the second layer, and
etching the second layer selective to the to the first semiconductor material so as to form a buried trench in the buffer region, and
filling the trench with an electrically conductive material.

4. The method of claim 3, wherein etching the barrier region and the buffer region comprises anisotropic dry etching, and wherein etching the second layer comprises wet chemical etching.

5. The method of claim 1, further comprising:
forming a gate electrode on the first cross-section over the buried field plate, the gate electrode being spaced apart from the channel by the barrier region;
forming a source electrode on the first cross-section being in ohmic contact with the channel; and
forming a drain electrode outside of the first and third cross-sections being in ohmic contact with the channel.

6. The method of claim 5, wherein the stepped lateral profile further comprises fourth and fifth cross-sections, the fifth cross-section being substantially equal in thickness to the first cross-section, the fourth cross-section interposed between the fifth and third cross-sections and forming oblique angles with the fifth and third cross-sections, and wherein the drain electrode is formed on the fifth cross-section.

7. The method of claim 1, further comprising growing a fifth layer of the first semiconductor material on the second layer prior to etching, and wherein etching semiconductor material from the buffer region comprises etching of both the fifth and second layers.

8. A method of forming a high-electron-mobility field effect transistor, the method comprising:
forming a buffer region comprising first, second and third cross-sections forming a stepped lateral profile, the first cross-section being thicker than the third cross-section, the second cross-section interposed between the first and third cross-sections and forming oblique angles with the first and third cross-sections; and
forming a buried field plate within the first cross section of the buffer region;
forming a barrier region of substantially uniform thickness along the stepped profile of the buffer region, the barrier region separated from the buried field plate by a portion of the buffer region,
wherein the buffer region is formed from gallium nitride and wherein the barrier region is formed from aluminum gallium nitride such that a two dimensional electron gas forms along the stepped lateral profile near an interface between the barrier region and the buffer region
wherein the buffer region is formed by an epitaxial growth process, and
wherein forming the buried field plate comprises epitaxially growing a second layer of gallium nitride or p-type gallium nitride on a first layer of gallium nitride as part of the buffer region,
wherein forming the buffer region comprises:
growing the layer of gallium nitride and the layer of p-type gallium nitride;
etching a lateral section of the p-type gallium nitride so as to form the stepped lateral profile and expose an end of the layer of p-type gallium nitride; and
regrowing a layer of gallium nitride so as to cover the exposed end with regrown gallium nitride,
wherein forming the barrier region comprises growing aluminum gallium nitride on the regrown gallium nitride, and
wherein the buried field plate comprises a lateral section of the layer of p-type gallium nitride that remains intact after etching.

9. A method of forming a high-electron-mobility field effect transistor, the method comprising:
- forming a buffer region having a stepped lateral profile disposed therein, the stepped lateral profile comprising first, second and third cross-sections of the buffer region, the first cross-section being thicker than the third cross-section, the second cross-section interposed between the first and third cross-sections and forming oblique angles with the first and third cross-sections;
- forming a barrier region along the stepped lateral profile of the buffer region,
- wherein the buffer region is formed from a first semiconductor material and the barrier region is formed from a second semiconductor material, the first and second semiconductor materials having different band-gaps such that an electrically conductive channel comprising a two-dimensional charge carrier gas arises at an interface between the buffer and barrier regions due to piezoelectric effects, and
- forming a buried field plate within the buffer region, the barrier region separated from the buried field plate by a portion of the buffer region,
- wherein forming the buried field plate comprises either one of:
  - (i) epitaxially forming a conductive layer of semiconductor material as part of the buffer region; and
  - wherein the buried field plate comprises a section of the conductive layer of semiconductor material; or
  - (ii) epitaxially growing a layer of semiconductor material as part of the buffer region;
  - etching the layer of semiconductor material selective to the buffer region so as to form a buried trench in the buffer region, and
- filling the buried trench with an electrically conductive material,
- wherein the buried field plate comprises the electrically conductive material that is filled in the buried trench.

* * * * *

UNITED STATES PATENT AND TRADEMARK OFFICE
CERTIFICATE OF CORRECTION

PATENT NO.        : 9,728,630 B2
APPLICATION NO.   : 14/478287
DATED             : August 8, 2017
INVENTOR(S)       : G. Prechtl et al.

Page 1 of 1

It is certified that error appears in the above-identified patent and that said Letters Patent is hereby corrected as shown below:

In the Claims

Column 13, Line 11 (Claim 1, Line 10) please change "cross section" to -- cross-section --
Column 13, Line 43 (Claim 1, Line 40) please change "layer aerial" to -- layer material --
Column 13, Line 51 (Claim 1, Line 48) please change "is separate" to -- is separated --
Column 14, Line 36 (Claim 8, Line 9) please change "cross section" to -- cross-section --
Column 14, Line 44 (Claim 8, Line 17) please change "two dimensional" to -- two-dimensional --

Signed and Sealed this
Twenty-sixth Day of September, 2017

Joseph Matal
*Performing the Functions and Duties of the
Under Secretary of Commerce for Intellectual Property and
Director of the United States Patent and Trademark Office*